US011539166B2

(12) United States Patent
Cao et al.

(10) Patent No.: US 11,539,166 B2
(45) Date of Patent: Dec. 27, 2022

(54) STRAP CONNECTOR

(71) Applicant: DONGGUAN LUXSHARE TECHNOLOGIES CO., LTD, Dongguan (CN)

(72) Inventors: Haihua Cao, Dongguan (CN); Qiongnan Chen, Dongguan (CN); Weijian Li, Dongguan (CN); Rongzhe Guo, Dongguan (CN)

(73) Assignee: DONGGUAN LUXSHARE TECHNOLOGIES CO., LTD, Dongguan (CN)

( * ) Notice: Subject to any disclaimer, the term of this patent is extended or adjusted under 35 U.S.C. 154(b) by 0 days.

(21) Appl. No.: 17/229,239

(22) Filed: Apr. 13, 2021

(65) Prior Publication Data

US 2021/0367379 A1    Nov. 25, 2021

(30) Foreign Application Priority Data

May 20, 2020   (CN) .......................... 202020856117.0

(51) Int. Cl.
| | |
|---|---|
| *H01R 13/633* | (2006.01) |
| *H01R 13/66* | (2006.01) |
| *H01R 13/627* | (2006.01) |
| *H01R 27/02* | (2006.01) |

(52) U.S. Cl.
CPC ..... *H01R 13/6335* (2013.01); *H01R 13/6272* (2013.01); *H01R 13/665* (2013.01); *H01R 27/02* (2013.01)

(58) Field of Classification Search
CPC ............ H01R 13/6272; H01R 13/6275; H01R 13/6335; H01R 13/665; H01R 27/02

USPC ......................................................... 439/352
See application file for complete search history.

(56) References Cited

U.S. PATENT DOCUMENTS

| | | | | |
|---|---|---|---|---|
| 7,572,138 B1* | 8/2009 | Wu | ..................... | H01R 13/6275 |
| | | | | 439/352 |
| 7,828,579 B2* | 11/2010 | Huang | ............... | H01R 13/6275 |
| | | | | 439/352 |
| 7,938,669 B2* | 5/2011 | Li | ...................... | H01R 13/6275 |
| | | | | 439/352 |

(Continued)

FOREIGN PATENT DOCUMENTS

| | | |
|---|---|---|
| CN | 207303530 U | 5/2018 |
| CN | 208299143 U | 12/2018 |
| CN | 210007025 U | 1/2020 |

*Primary Examiner* — Gary F Paumen
(74) *Attorney, Agent, or Firm* — Birch, Stewart, Kolasch & Birch, LLP

(57) ABSTRACT

A strap connector includes an insulating body, a conductive element, a locking member, a pressing block, and a strap connected with the pressing block. The locking member includes a main body portion and a locking elastic arm. The main body portion includes a top plate. The locking elastic arm extends from the top plate and is used for locking with a mating connector. The pressing block is slidable backwardly under the pulling of the strap, so that the pressing block presses the top plate downwardly, and then the locking elastic arm moves downwardly to realize unlocking. When the unlocking method disclosed in the present disclosure is performed, it is only necessary to ensure that the pressing block slides over the top plate, which improves the reliability of unlocking.

18 Claims, 11 Drawing Sheets

(56) References Cited

U.S. PATENT DOCUMENTS

| | | | | |
|---|---|---|---|---|
| 8,475,198 B2* | 7/2013 | Wu | ................... | H01R 13/6275 |
| | | | | 439/352 |
| 8,500,470 B2* | 8/2013 | Wang | ................... | G02B 6/4261 |
| | | | | 439/352 |
| 8,668,515 B2* | 3/2014 | Wu | ..................... | H01R 13/633 |
| | | | | 439/352 |
| 8,740,637 B2* | 6/2014 | Wang | ................ | H01R 13/6335 |
| | | | | 439/352 |
| 2016/0149341 A1* | 5/2016 | Reed | ................ | H01R 13/6275 |
| | | | | 439/352 |

* cited by examiner

STRAP CONNECTOR

CROSS-REFERENCE TO RELATED APPLICATION

This patent application claims priority of a Chinese Patent Application No. 202020856117.0, filed on May 20, 2020 and titled "STRAP CONNECTOR", the entire content of which is incorporated herein by reference.

TECHNICAL FIELD

The present disclosure relates to a strap connector which belongs to a technical field of connectors.

BACKGROUND

A kind of existing strap connectors include a locking member and a strap connected to the locking member, wherein the locking member is provided with a pair of locking arms for mating with a mating connector. When it is necessary to unlock with the mating connector, the strap is pulled backwardly to lower the position of the locking member, and finally the locking arm will be separated from the mating connector. However, this unlocking method of pulling the locking arm by directly pulling the strap makes it difficult to control the force when pulling the strap, thereby making the unlocking method unreliable.

SUMMARY

An object of the present disclosure is to provide a strap connector with a more reliable unlocking method.

In order to achieve the above object, the present disclosure adopts the following technical solution: a strap connector comprising an insulating body comprising a top wall, the top wall comprising a recessed portion and a slit located in front of the recessed portion; a conductive element adapted for electrically mating with a mating connector; a locking member comprising a main body portion located in the recessed portion and a locking elastic arm extending forwardly from the main body portion, the main body portion comprising a top plate from which the locking elastic arm extends, the locking elastic arm extending into the slit and protruding beyond the top wall, and the locking elastic arm being adapted for locking with the mating connector; a pressing block located above the locking member; and a strap connected to the pressing block; wherein the pressing block is slidable backwardly under pulling of the strap, so that the pressing block presses the top plate downwardly, thereby causing the locking elastic arm to move downwardly for unlocking with the mating connector.

In order to achieve the above object, the present disclosure adopts the following technical solution: a strap connector comprising an insulating body comprising a top wall, the top wall comprising a recessed portion and a pair of slits located in front of the recessed portion; a conductive element adapted for electrically mating with a mating connector; a locking member comprising a main body portion located in the recessed portion and a pair of locking elastic arms extending forwardly from the main body portion, the main body portion comprising a top plate, the locking elastic arms extending into the slits and protruding beyond the top wall, and the locking elastic arms being adapted for locking with the mating connector; a pressing block located above the locking member; and a strap connected to the pressing block; wherein the pressing block is slidable backwardly under pulling of the strap, so that the pressing block presses the top plate downwardly, thereby causing the locking elastic arms to move downwardly for unlocking with the mating connector.

Compared with the prior art, the present disclosure is provided with a pressing block, and the strap is connected with the pressing block. The pressing block is slidable backwardly under the pulling of the strap, so that the pressing block presses downwardly the top plate, and then the locking elastic arm moves downwardly to unlock with the mating connector. This unlocking method only needs to ensure that the pressing block slides over the top plate when unlocking, which improves the reliability of unlocking.

DETAILED DESCRIPTION

Figure 1:
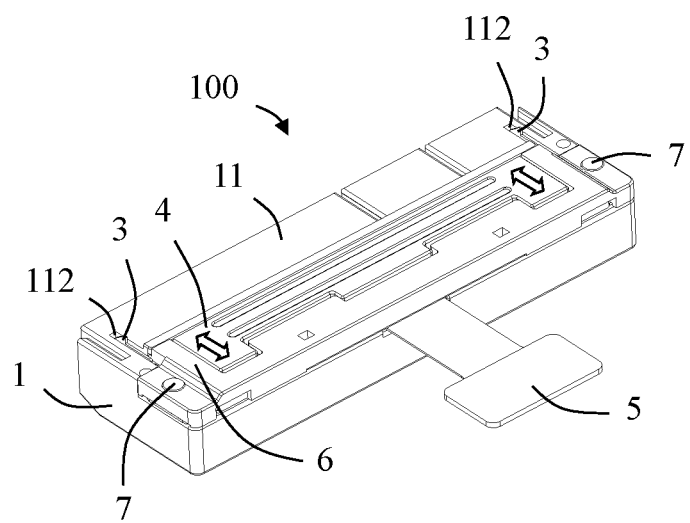
FIG. 1 is a perspective schematic view of a strap connector in accordance with an embodiment of the present disclosure.

Exemplary embodiments will be described in detail here, examples of which are shown in drawings. When referring to the drawings below, unless otherwise indicated, same numerals in different drawings represent the same or similar elements. The examples described in the following exemplary embodiments do not represent all embodiments consistent with this application. Rather, they are merely examples of devices and methods consistent with some aspects of the application as detailed in the appended claims.

The terminology used in this application is only for the purpose of describing particular embodiments, and is not intended to limit this application. The singular forms "a", "said", and "the" used in this application and the appended claims are also intended to include plural forms unless the context clearly indicates other meanings.

It should be understood that the terms "first", "second" and similar words used in the specification and claims of this application do not represent any order, quantity or importance, but are only used to distinguish different components. Similarly, "an" or "a" and other similar words do not mean a quantity limit, but mean that there is at least one; "multiple" or "a plurality of" means two or more than two. Unless otherwise noted, "front", "rear", "lower" and/or "upper" and similar words are for ease of description only and are not limited to one location or one spatial orientation. Similar words such as "include" or "comprise" mean that elements or objects appear before "include" or "comprise" cover elements or objects listed after "include" or "comprise" and their equivalents, and do not exclude other elements or objects. The term "a plurality of" mentioned in the present disclosure includes two or more.

Hereinafter, some embodiments of the present disclosure will be described in detail with reference to the accompanying drawings. In the case of no conflict, the following embodiments and features in the embodiments can be combined with each other.

Referring to FIGS. 1 to 11, the present disclosure discloses a strap connector 100 including an insulating body 1, a conductive element 2 for mating with a mating connector (not shown) to achieve electrical connection, a locking member 3 fixed to the insulating body 1, a pressing block 4 located above the locking member 3, a strap 5 connected with the pressing block 4, and a rear cover 6 fixed to the insulating body 1.

Figure 2:
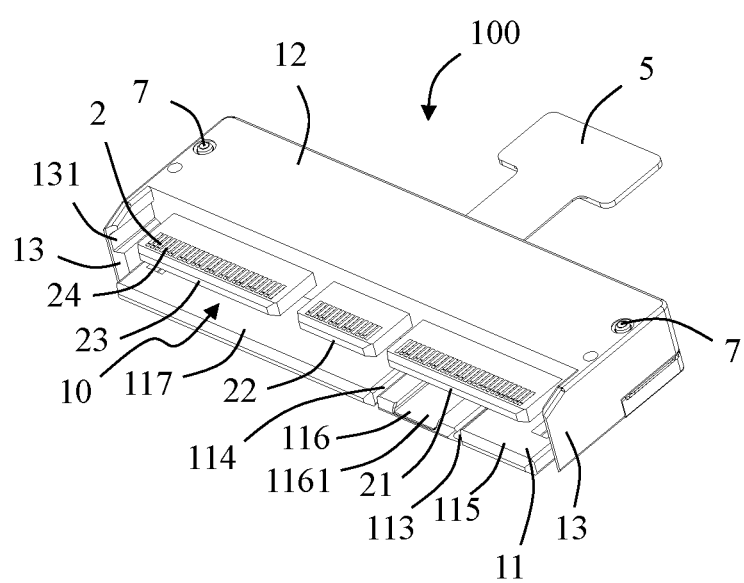
FIG. 2 is a perspective schematic view of FIG. 1 from another angle.
Figure 3:
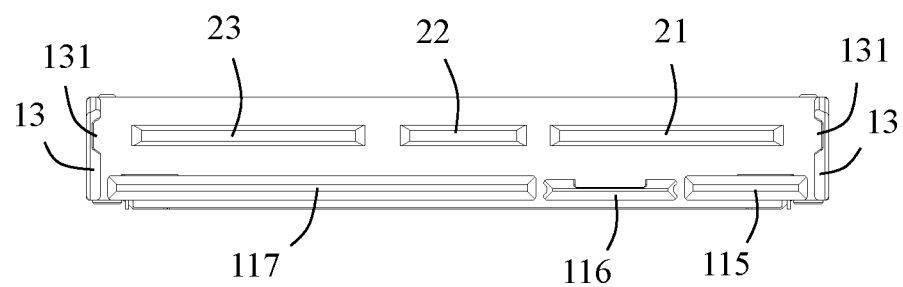
FIG. 3 is a front view of FIG. 2.
Figure 4:
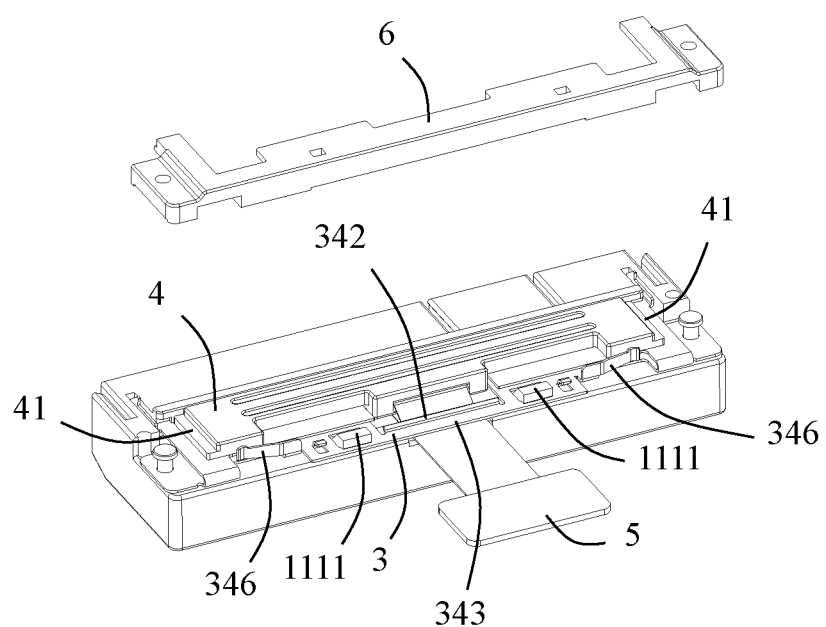
FIG. 4 is a partially exploded perspective view of FIG. 1, in which a rear cover is separated.

Referring to FIGS. 2 to 5, the insulating body 1 includes a top wall 11, a bottom wall 12 and two side walls 13. The top wall 11 extends forwardly beyond the bottom wall 12 so as to form a mating space 10 below the top wall 11. The mating space 10 is opened downwardly and adapted to receive the mating connector. The top wall 11 includes a recessed portion 111 located at a rear end of the top wall 11, and a slit 112 located in front of the recessed portion 111 and communicating with the recessed portion 111. In the illustrated embodiment of the present disclosure, two slits 112 are provided and are located on both sides of the top wall 11. Referring to FIGS. 2 and 3, the top wall 11 includes a first groove 113 and a second groove 114 which are spaced apart from each other along a width direction of the insulating body 1. The first groove 113 and the second groove 114 extend forwardly through the top wall 11 so as to divide the top wall 11 into a first wall 115, a second wall 116 and a third wall 117. The second wall 116, located between the first wall 115 and the third wall 117, is provided with a first guiding groove 1161. The side wall 13 is provided with a second guiding groove 131. The first guiding groove 1161 and the second guiding groove 131 are used to guide the mating connector.

In the illustrated embodiment of the present disclosure, the conductive element 2 is a circuit board which is fixed to the insulating body 1. The circuit board includes a first mating portion 21, a second mating portion 22 and a third mating portion 23. The first mating portion 21, the second mating portion 22 and the third mating portion 23 are spaced apart along a horizontal direction and extend into the mating space 10. The second mating portion 22 is located between the first mating portion 21 and the third mating portion 23. A width of the second mating portion 22 is smaller than a width of the first mating portion 21. The width of the second mating portion 22 is smaller than a width of the third mating portion 23. The first wall portion 115 and the second wall portion 116 correspond to the first mating portion 21. The third wall portion 117 corresponds to the second mating portion 22 and the third mating portion 23. The surfaces of the first mating portion 21, the second mating portion 22, and the third mating portion 23 are provided with a plurality of conductive pads 24 for electrically connecting with the mating connector.

Of course, in other embodiments, the conductive element 2 may also be a plurality of conductive terminals fixed to the insulating body 1. At this time, the first mating portion 21, the second mating portion 22 and the third mating portion 23 may be integrally formed with the insulating body 1. The conductive terminals are fixed to the insulating body 1 by assembling or insert molding and extend to the first mating portion 21, the second mating portion 22 and the third mating portion 23. Since this arrangement of conductive terminals is already well known to those skilled in the art, which will not be repeated here in the present disclosure.

Figure 5:
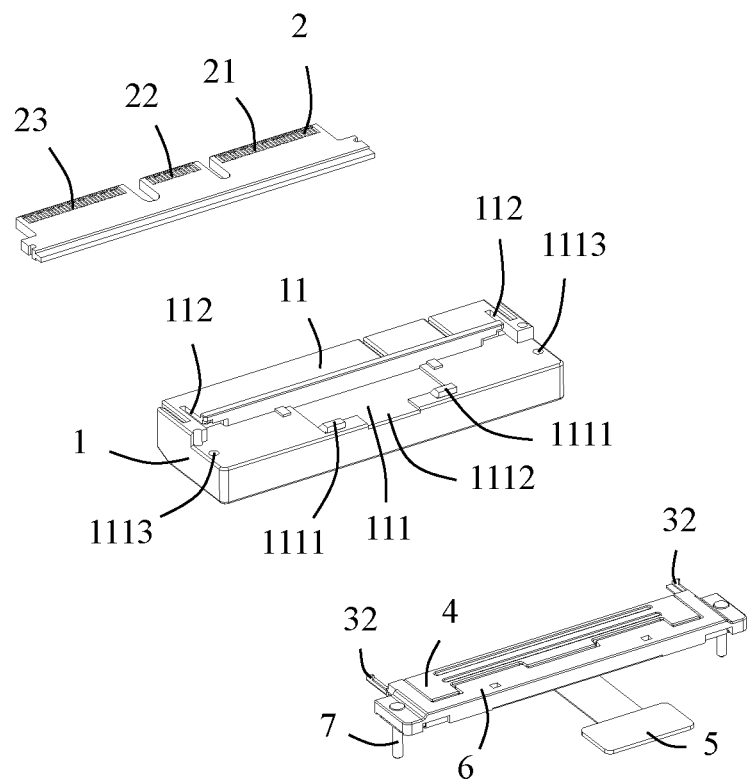
FIG. 5 is a further perspective exploded view with the rear cover in FIG. 4 removed.
Figure 6:
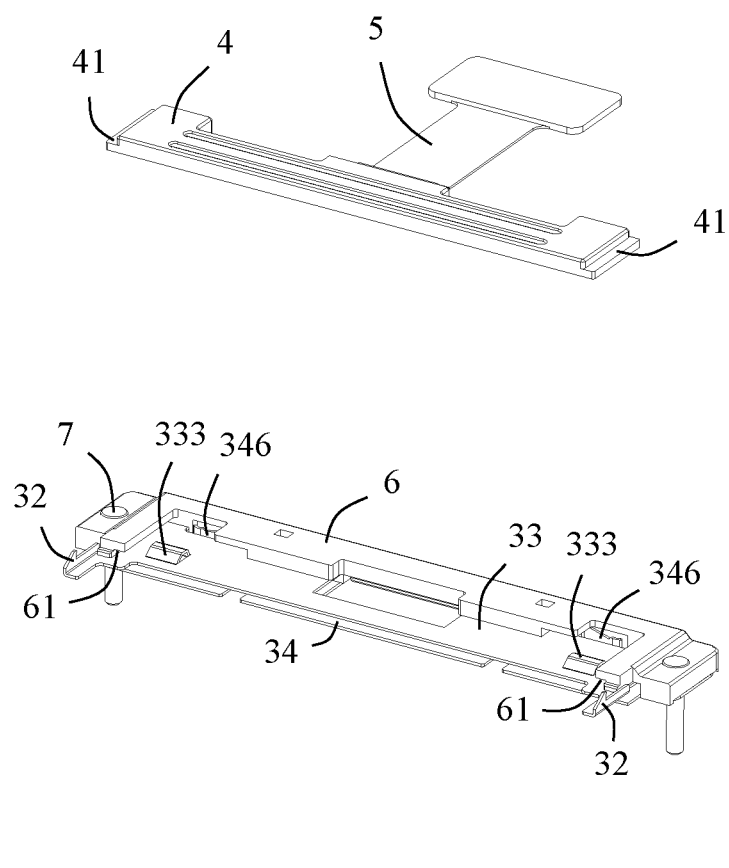
FIG. 6 is a perspective schematic view of the strap connector when a pressing block is separated from the rear cover.
Figure 7:
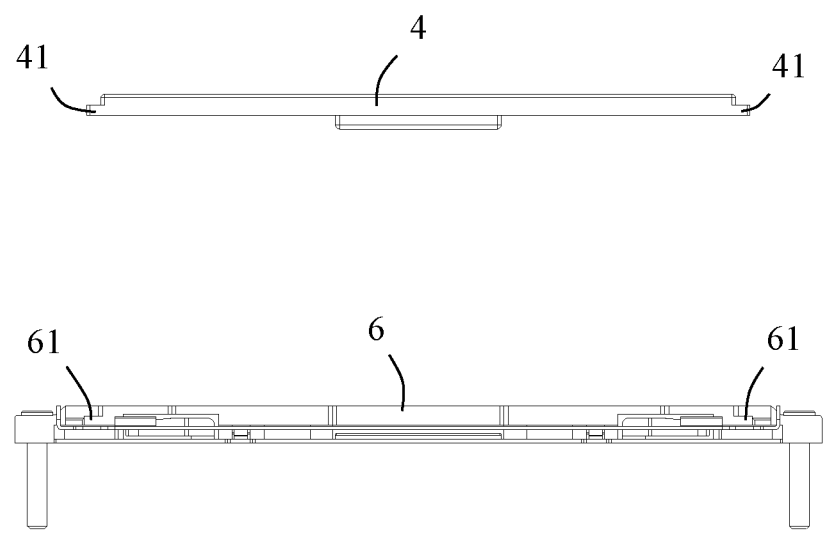
FIG. 7 is a front view of FIG. 6.

Referring to FIG. 5, in the illustrated embodiment of the present disclosure, the insulating body 1 further includes a pair of positioning protrusions 1111 protruding forwardly into the recessed portion 111, a strap groove 1112 formed between the pair of positioning protrusions 1111, and a pair of first through holes 1113 extending through the recessed portion 111 along a thickness direction of the insulating body 1. The positioning protrusion 1111 is used for positioning the locking member 3. The strap groove 1112 is used to allow the strap 5 to pass through.

Referring to FIGS. 6 to 11, the locking member 3 includes a main body portion 31 located in the recessed portion 111 and at least one locking elastic arm 32 extending forwardly from the main body portion 31. In the illustrated embodiment of the present disclosure, the locking member 3 is formed by stamping and bending a metal sheet. A side of the main body portion 31 is substantially U-shaped, and includes a top plate 33, a bottom plate 34 located below the top plate 33 and spaced apart from the top plate 33, and a connecting portion 35 connecting the top plate 33 and the bottom plate 34.

Figure 8:
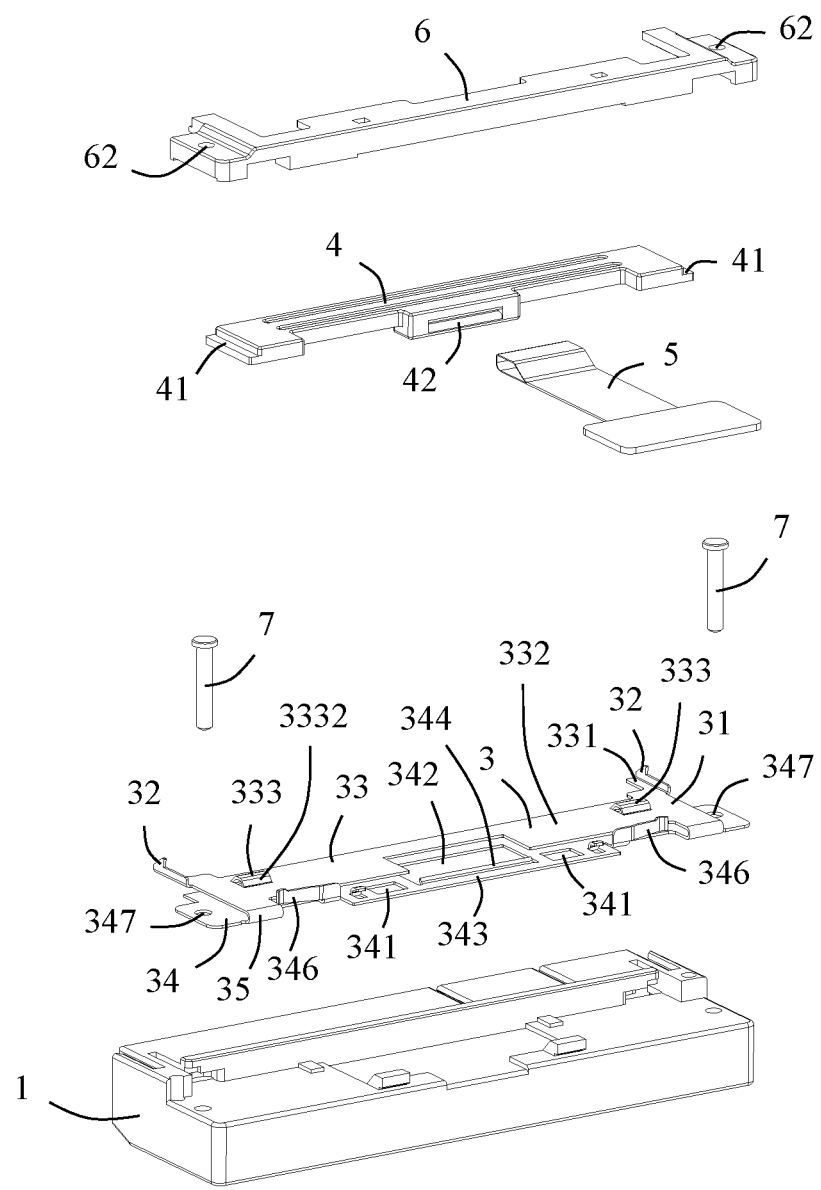
FIG. 8 is a further perspective exploded view.
Figure 9:
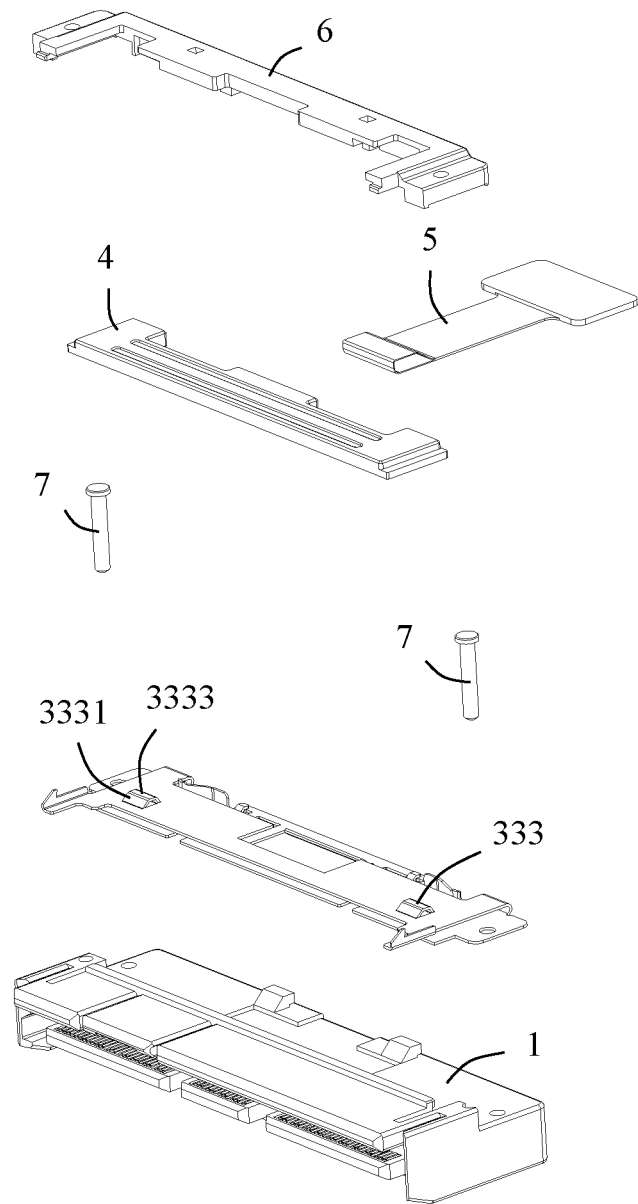
FIG. 9 is a perspective exploded view of FIG. 8 from another angle.

The top plate 33 includes an extension portion 331 extending forwardly. The locking elastic arm 32 is bent from a side of the extension portion 331. The locking elastic arm 32 is perpendicular to the extension portion 331. In the illustrated embodiment of the present disclosure, there are two locking elastic arms 32. The locking elastic arms 32 extend into the slits 112 and protrude upwardly beyond the top wall 11. In addition, the top plate 33 is further provided with a top surface 332 and at least one protrusion 333 protruding beyond the top surface 332. In the illustrated embodiment of the present disclosure, two protrusions 333 are provided and located on both sides of the top surface 332. In the illustrated embodiment of the present disclosure, the protrusions 333 are stamped from the top plate 33. Referring to FIGS. 8 and 9, each protrusion 333 is provided with a first inclined guide surface 3331 located at one end, a second inclined guide surface 3332 located at the other end, and a connecting plane 3333 connecting the first inclined guide surface 3331 and the second inclined guide surface 3332. The first inclined guide surface 3331 is used to guide the pressing block 4 when the pressing block 4 moves backwardly. The second inclined guide surface 3332 is used to guide the pressing block 4 when the pressing block 4 is reset forwardly.

The bottom plate 34 is fixed on the top wall 11. The bottom plate 34 is provided with two positioning openings 341 for mating with the positioning protrusions 1111, a notch 342 between the two positioning openings 341, and a pressing portion 343 located behind the notch 342. In addition, the bottom plate 34 is provided with a pair of second through holes 347 corresponding to the pair of first through holes 1113. The pressing portion 343 is provided with a guide portion 344 extending obliquely and upwardly from a rear edge of the notch 342. The guide portion 344 is provided with an arc-shaped guide surface for engaging with the strap 5. The strap 5 passes through the notch 342 and extends outwardly and downwardly from the pressing portion 343. In an embodiment of the present disclosure, the locking elastic arm 32 facilitates the return of the pressing block 4 after unlocking. The bottom plate 34 is further provided with elastic sheets 346 respectively bent upwardly from a rear end of the bottom plate 34. Two elastic sheets 346 are provided, and extending directions of the two elastic sheets 346 are opposite and at least partially protrude beyond the top surface 332.

The rear cover 6 is provided with a pair of sliding grooves 61 extending along a front and back direction and a pair of third through holes 62 corresponding to the pair of second through holes 347. In an embodiment of the present disclosure, the strap connector 100 is provided with a pair of heat melt posts 7 correspondingly extending through the third through holes 62, the second through holes 347 and the first through holes 1113. The bottom plate 34 can be fixed between the insulating body 1 and the rear cover 6 through the heat melt posts 7. Of course, in other embodiments, the bottom plate 34 can also be fixed to the insulating body 1 by means of assembling or insert molding etc.

Figure 10:
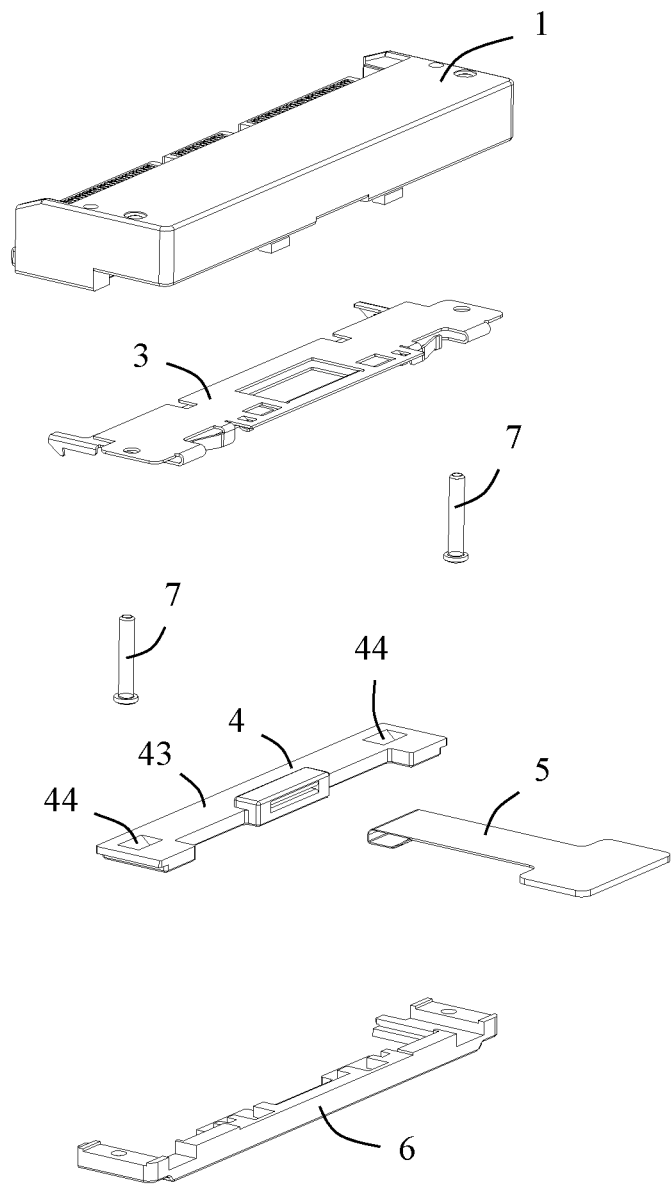
FIG. 10 is a perspective exploded view of FIG. 9 from another angle.
Figure 11:
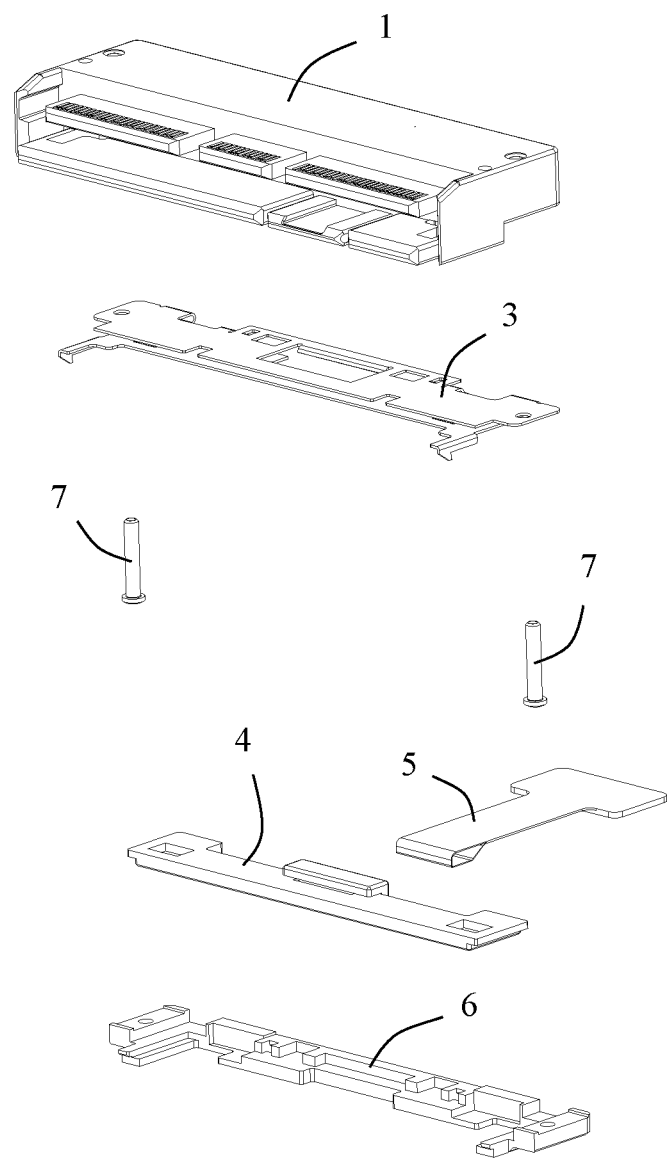
FIG. 11 is an exploded perspective view of FIG. 10 from another angle.

The pressing block 4 includes a pair of sliding portions 41 received in the sliding grooves 61 and a strap hole 42 for installing the strap 5. In the illustrated embodiment of the present disclosure, the sliding portions 41 are located on both sides of the pressing block 4, and the rear cover 6 presses the pressing block 4 from the top, thereby preventing the pressing block 4 from being detached upwardly from the rear cover 6. Referring to FIG. 10, the pressing block 4 has a bottom surface 43 and a plurality of locking slots 44 located on the bottom surface 43 and used for receiving the protrusions 333.

In the illustrated embodiment of the present disclosure, before unlocking, the protrusions 333 are at least partially received in the locking slots 44, so that the pressing block 4 does not press the locking elastic arms 32 downwardly. When unlocking is performed, the pressing block 4 is slidable backwardly under the pulling of the strap 5, and the protrusions 333 are guided by the first inclined guide surfaces 3331 to escape from the locking slots 44. Since the height of the pressing block 4 is constant, as the pressing block 4 further moving backwardly, the bottom surface 43 of the pressing block 4 presses the protrusions 333 downwardly, thereby causing the locking elastic arms 32 to move downwardly for unlocking with the mating connector. At this time, the strap connector 100 and the mating connector can be separated from each other. The rear end of the pressing block 4 presses the elastic sheet 346. The elastic sheet 346 is used to push the pressing block 4 forwardly when the strap 5 is released, so as to reset the pressing block 4.

Compared with the prior art, the present disclosure is provided with the pressing block 4, and the strap 5 is connected to the pressing block 4. The pressing block 4 is slidable backwardly under the pulling of the strap 5, so that the pressing block 4 presses the top plate 33 downwardly, and then the locking elastic arms 32 move downwardly to realize unlocking. This unlocking method only needs to ensure that the pressing block 4 slides over the top plate 33 when unlocking, which improves the reliability of unlocking.

It should be noted that in the illustrated embodiment of the present disclosure, the protrusions 333 are disposed on the locking member 3, and the bottom surface 43 of the pressing block 4 press the protrusions 333 downwardly, thereby realizing unlocking. In other embodiments, the protrusions 333 can also be arranged on the bottom surface of the pressing block 4, and the locking member 3 is pressed downwardly by the protrusions 333, and the unlocking function can also be realized.

The above embodiments are only used to illustrate the present disclosure and not to limit the technical solutions described in the present disclosure. The understanding of this specification should be based on those skilled in the art. Descriptions of directions, although they have been described in detail in the above-mentioned embodiments of the present disclosure, those skilled in the art should understand that modifications or equivalent substitutions can still be made to the application, and all technical solutions and improvements that do not depart from the spirit and scope of the application should be covered by the claims of the application.

What is claimed is:

1. A strap connector, comprising:
   an insulating body comprising a top wall, the top wall comprising a recessed portion and a slit located in front of the recessed portion;
   a conductive element adapted for electrically mating with a mating connector;
   a locking member comprising a main body portion located in the recessed portion and a locking elastic arm extending forwardly from the main body portion, the main body portion comprising a top plate from which the locking elastic arm extends, the locking elastic arm extending into the slit and protruding beyond the top wall, and the locking elastic arm being adapted for locking with the mating connector;
   a pressing block located above the locking member; and
   a strap connected to the pressing block;
   wherein the pressing block is slidable backwardly under pulling of the strap, so that the pressing block presses the top plate downwardly, thereby causing the locking elastic arm to move downwardly for unlocking with the mating connector;
   wherein the top plate comprises a top surface and a protrusion protruding beyond the top surface, the pressing block comprises a bottom surface and a locking slot located on the bottom surface for receiving the protrusion, and the protrusion comprises a first inclined guide surface for guiding the pressing block when the pressing block slides backwardly and leaves the locking slot; and
   wherein the main body portion comprises an elastic sheet at a rear end thereof, and the elastic sheet is configured to push the pressing block forwardly when the strap is released, so as to reset the pressing block.

2. The strap connector according to claim 1, wherein two slits are provided and located on both sides of the top wall, two locking elastic arms are provided and located on both sides of the top surface, and the protrusion is stamped from the top plate.

3. The strap connector according to claim 1, wherein the main body portion comprises a bottom plate located below the top plate and spaced apart from the top plate, and a connecting portion connecting the top plate and the bottom plate; and wherein the bottom plate is fixed on the top wall, two elastic sheets are respectively bent upwardly from a rear end of the bottom plate, extending directions of the elastic sheets are opposite, and the elastic sheets at least partly protrude beyond the top surface.

4. The strap connector according to claim 3, wherein the bottom plate comprises a notch and a pressing portion located behind the notch, the pressing portion comprises a guide portion extending obliquely and upwardly from a rear edge of the notch, the guide portion is provided with an arc-shaped guide surface for pressing the strap, and the strap extends through the notch and extends outwardly and downwardly beyond the pressing portion.

5. The strap connector according to claim 1, wherein the conductive element is a circuit board mounted to the insulating body, and the circuit board comprises a plurality of conductive pads for mating with the mating connector.

6. The strap connector according to claim 5, wherein the insulating body comprises a mating space located below the top wall, the mating space is opened downwardly, the circuit board comprises a first mating portion, a second mating portion and a third mating portion, the first mating portion, the second mating portion and the third mating portion are spaced apart along a horizontal direction, the second mating portion is located between the first mating portion and the third mating portion, a width of the second mating portion is smaller than a width of the first mating portion, and the width of the second mating portion is smaller than a width of the third mating portion.

7. A strap connector, comprising:
an insulating body comprising a top wall, the top wall comprising a recessed portion and a slit located in front of the recessed portion;
a conductive element adapted for electrically mating with a mating connector;
a locking member comprising a main body portion located in the recessed portion and a locking elastic arm extending forwardly from the main body portion, the main body portion comprising a top plate from which the locking elastic arm extends, the locking elastic arm extending into the slit and protruding beyond the top wall, and the locking elastic arm being adapted for locking with the mating connector;
a pressing block located above the locking member; and
a strap connected to the pressing block;
wherein the pressing block is slidable backwardly under pulling of the strap, so that the pressing block presses the top plate downwardly, thereby causing the locking elastic arm to move downwardly for unlocking with the mating connector;
wherein the strap connector comprises a sliding groove for mating with the pressing block, and the pressing block is slidable along the sliding groove under the pulling of the strap; and
wherein the strap connector further comprises a rear cover located on the top plate, the sliding groove is arranged on the rear cover, and the strap connector comprises a heat melt post extending through the rear cover, the bottom plate and the insulating body in order to fix the bottom plate to the insulating body.

8. A strap connector, comprising:
an insulating body comprising a top wall, the top wall comprising a recessed portion and a pair of slits located in front of the recessed portion;
a conductive element adapted for electrically mating with a mating connector;
a locking member comprising a main body portion located in the recessed portion and a pair of locking elastic arms extending forwardly from the main body portion, the main body portion comprising a top plate, the locking elastic arms extending into the slits and protruding beyond the top wall, and the locking elastic arms being adapted for locking with the mating connector, the top plate comprising two protrusions which are spaced apart from each other;
a pressing block located above the locking member; and
a strap connected to the pressing block;
wherein the pressing block is slidable backwardly along a first direction under pulling of the strap, so that the pressing block presses against the two protrusions of the top plate simultaneously and downwardly along a second direction perpendicular to the first direction, thereby causing the locking elastic arms to move downwardly for unlocking with the mating connector; and
wherein the two protrusions are spaced apart from each other along a third direction perpendicular to the first direction and the second direction, each protrusion comprises a first inclined guide surface for guiding the pressing block when the pressing block slides backwardly.

9. The strap connector according to claim 8, wherein the top plate comprises a top surface, the two protrusions protruding upwardly beyond the top surface, the pressing block comprises a bottom surface and two locking slots located on the bottom surface for receiving the two protrusions, respectively.

10. The strap connector according to claim 9, wherein the two protrusions are stamped from the top plate.

11. The strap connector according to claim 9, wherein the main body portion comprises an elastic sheet at a rear end thereof, and the elastic sheet is configured to push the pressing block forwardly when the strap is released, so as to reset the pressing block.

12. The strap connector according to claim 11, wherein the main body portion comprises a bottom plate located below the top plate and spaced apart from the top plate, and a connecting portion connecting the top plate and the bottom plate; and wherein the bottom plate is fixed on the top wall, two elastic sheets are respectively bent upwardly from a rear end of the bottom plate, extending directions of the elastic sheets are opposite, and the elastic sheets at least partly protrude beyond the top surface.

13. The strap connector according to claim 12, wherein the bottom plate comprises a notch and a pressing portion located behind the notch, the pressing portion comprises a guide portion extending obliquely and upwardly from a rear edge of the notch, the guide portion is provided with an arc-shaped guide surface for pressing the strap, and the strap extends through the notch and extends outwardly and downwardly beyond the pressing portion.

14. The strap connector according to claim 8, further comprising a sliding groove for mating with the pressing block, and the pressing block is slidable along the sliding groove under the pulling of the strap.

15. The strap connector according to claim 14, further comprising a rear cover located on the top plate, the sliding groove being arranged on the rear cover, and the strap connector comprising a heat melt post extending through the rear cover, the bottom plate and the insulating body in order to fix the bottom plate to the insulating body.

16. The strap connector according to claim 8, wherein the conductive element is a circuit board mounted to the insulating body, and the circuit board comprises a plurality of conductive pads for mating with the mating connector.

17. The strap connector according to claim 16, wherein the insulating body comprises a mating space located below the top wall, the mating space is opened downwardly, the circuit board comprises a first mating portion, a second mating portion and a third mating portion, the first mating portion, the second mating portion and the third mating portion are spaced apart along a horizontal direction, the second mating portion is located between the first mating portion and the third mating portion, a width of the second mating portion is smaller than a width of the first mating portion, and the width of the second mating portion is smaller than a width of the third mating portion.

18. The strap connector according to claim 8, wherein the two protrusions are hided under the pressing block along the send direction without being exposed to an outside.

\* \* \* \* \*